United States Patent
Henning

[19]

[11] Patent Number: 5,908,576
[45] Date of Patent: Jun. 1, 1999

[54] ROTISSERIE APPARATUS FOR MICROWAVE OVEN

[76] Inventor: Jeffrey D. Henning, 4609 Penzance Pl., Upper Marlboro, Md. 20772

[21] Appl. No.: 08/951,577

[22] Filed: Oct. 16, 1997

Related U.S. Application Data

[63] Continuation-in-part of application No. 08/503,467, Jul. 18, 1995, Pat. No. 5,837,980.

[51] Int. Cl.$^6$ ........................................... H05B 6/78
[52] U.S. Cl. .................... 219/753; 219/754; 219/767; 126/338; 99/DIG. 14; 99/421 HV
[58] Field of Search .................. 219/753, 752, 219/754, 755, 762; 126/338; 99/421 H, 421 HH, 421 HV, DIG. 14

[56] References Cited

U.S. PATENT DOCUMENTS

| | | | |
|---|---|---|---|
| 1,337,122 | 4/1920 | Doak | 99/345 |
| 2,787,948 | 4/1957 | Mathis | 99/421 |
| 2,845,856 | 8/1958 | Sack | 99/421 |
| 4,074,102 | 2/1978 | Asen | 219/10.55 E |
| 4,286,133 | 8/1981 | Einset | 219/753 |
| 4,571,474 | 2/1986 | Pomroy | 219/10.55 F |
| 4,652,712 | 3/1987 | Zeipel | 219/753 |
| 4,659,890 | 4/1987 | Viet | 219/10.55 M |
| 4,714,813 | 12/1987 | Trenchard | 219/10.55 F |
| 4,717,802 | 1/1988 | Colato | 219/10.55 E |
| 4,810,856 | 3/1989 | Jovanovic | 219/401 |
| 4,822,967 | 4/1989 | Kumagami et al. | 219/10.55 F |
| 4,985,607 | 1/1991 | Oya | 219/10.55 E |
| 5,643,486 | 7/1997 | Aurensan et al. | 219/752 |

FOREIGN PATENT DOCUMENTS

| | | | |
|---|---|---|---|
| 3-213910 | 9/1991 | Japan | 219/753 |

*Primary Examiner*—Philip H. Leung
*Attorney, Agent, or Firm*—Foley & Lardner

[57] ABSTRACT

An insert for an oven, such as a microwave oven, includes an adapting mechanism compatible with a drive mechanism of the oven, a food treatment element, and at least one drive shaft coupled between the food treatment element and the adapting mechanism. The insert converts rotational forces conventionally used for driving a turntable into forces for driving a food treatment element, such as a rotisserie element.

18 Claims, 7 Drawing Sheets

107A

107B

107C

107D

ROTISSERIE APPARATUS FOR MICROWAVE OVEN

CROSS-REFERENCE

The invention is a continuation-in-part of application Ser. No. 08/503,467, filed Jul. 18, 1995, U.S. Pat. No. 5,837,980 and incorporated herein by reference.

BACKGROUND OF THE INVENTION

The invention relates to a rotisserie apparatus for use in an oven, for example, a microwave oven.

Many conventional microwave ovens are equipped with a turntable mechanism. The turntable mechanism conventionally comprises a turntable that mates with a drive shaft. The drive shaft is coupled to a conventional driving mechanism which turns the drive shaft around an axis. The rotation of the drive shaft around the axis causes the turntable to also rotate around the axis.

SUMMARY OF THE INVENTION

The invention takes advantage of the rotational action of a drive shaft around an axis, and converts this rotation into a rotational action in an axis perpendicular to the axis of the drive shaft in order to provide alternative cooking approaches, such as, for example, a rotisserie.

In a first embodiment, the invention is in the form of an insert for a conventional oven, such as, a microwave oven. The invention includes a first adapter compatible with a drive mechanism of the oven. The insert also includes a second adapter compatible with the first adapter to transfer rotational forces from the drive mechanism to the second adapter. The insert also includes a food treatment element, such as, a rotisserie element. Further, the insert includes at least one drive shaft coupled between the food treatment element and the second adapter. For example, a first drive shaft can be engaged with the second adapter while a second drive shaft is engaged with both the first drive shaft and the food treatment element.

Alternatively, the insert can include an adapting mechanism compatible with a drive mechanism of the oven, a food treatment element, and at least one drive shaft coupled between the food treatment element and the adapting mechanism.

In the embodiments that include both first and second adapters, the first adapter can include three prongs extending toward the drive mechanism and a first coupling element extending toward the second adapter. The first coupling element can be either a female coupling element or a male coupling element. The second adapter in such an embodiment will include a second coupling element that is compatible with the first coupling element and extending toward the first adapter. If the first coupling element is a female, the second coupling element will be a male. Alternatively, if the first coupling element is a male, the second coupling element will be a female. The first drive shaft can have a first bevelled gear that engages with the second adapter and a second bevelled gear that engages the second drive shaft. The second drive shaft can have a third bevelled gear that engages the second bevelled gear and a fourth bevelled gear that engages the food treatment element. Finally, the food treatment element can have a fifth bevelled gear that engages the fourth bevelled gear.

This embodiment can further include a drive support positioned intermediate the first adapter and the second adapter. This drive support can include a first support that supports the second adapter in a position vertically displaced from the first adapter. The drive support can further include a plurality of ribs supporting the first drive shaft in a position substantially perpendicular to a central axis of either the first adapter or the second adapter. Also, the drive support can include a second support that supports the second drive shaft in a position substantially perpendicular to a central axis of the first drive shaft.

The first embodiment can further include a holding mechanism that positions the food treatment element in a desired position while the food treatment element is engaged with the second drive shaft. The holding mechanism can include a base portion and a first vertical support portion. The first vertical support portion can include a cavity for housing the second drive shaft and an opening exposing the fourth bevelled gear of the second drive shaft to the fifth bevelled gear of the food treatment element. Further, the first vertical support portion can include a hood positioned over the opening and including a third support to support the second drive shaft in the position substantially perpendicular to the central axis of the first drive shaft.

The food treatment element can further include an idle gear which is positioned substantially coaxially with the fifth bevelled gear. The holding mechanism can further comprise a second vertical support portion, including an idle gear support element, that engages with the idle gear of the food treatment element.

The fifth bevelled gear of the food treatment element can extend from the food treatment element on an end of a shaft and can further include a first locking mechanism for securing the fifth bevelled gear in the opening. The first vertical support portion can include a first locking mechanism receiving element that engages with the first locking mechanism when the food treatment element is positioned in a locked position.

A second locking mechanism can secure the idle gear within the idle gear support element. The second vertical support portion can include a second locking mechanism receiving element that engages with the second locking mechanism when the food treatment element is positioned in the locked position.

A second embodiment of the invention includes an oven, such as, for example, a microwave oven, a drive mechanism, an adapting mechanism coupled to the drive mechanism, a food treatment element, and at least one drive shaft coupled between the food treatment element and the adapting mechanism. The oven of the second embodiment can further include any portion of, or all of, the elements discussed above relating to the insert of the first embodiment.

In a third embodiment, an insert for an oven includes an adapter for engaging a drive mechanism of the oven, and translational elements for converting rotational forces of the drive mechanism along an axis of the drive mechanism into rotational forces along an axis substantially perpendicular to the axis of the drive mechanism. In this embodiment, the insert does not rotate about the axis of the drive mechanism and can be secured, for example, by securing elements to prevent the insert from rotating about the axis of the drive mechanism. The securing elements can include, for example, rubber stoppers.

A fourth embodiment according to the invention includes an adapter for converting rotational forces of a drive mechanism of an oven turntable. The adapter includes three prongs extending toward the drive mechanism and a first coupling element extending away from the drive mechanism. The three prongs can be equally spaced about an axis of the drive mechanism.

In another embodiment, a device for converting rotational forces of a drive mechanism of an oven turntable according to the invention includes a first adapter having three prongs extending toward the drive mechanism and a first coupling element extending away from the drive mechanism, and a second adapter including a second coupling element compatible with the first coupling element and extending toward the first adapter.

BRIEF DESCRIPTION OF THE DRAWINGS

The invention will be understood by reviewing the following detailed description in light of the drawings, wherein.

DETAILED DESCRIPTION OF THE PREFERRED EMBODIMENTS

Figure 1:
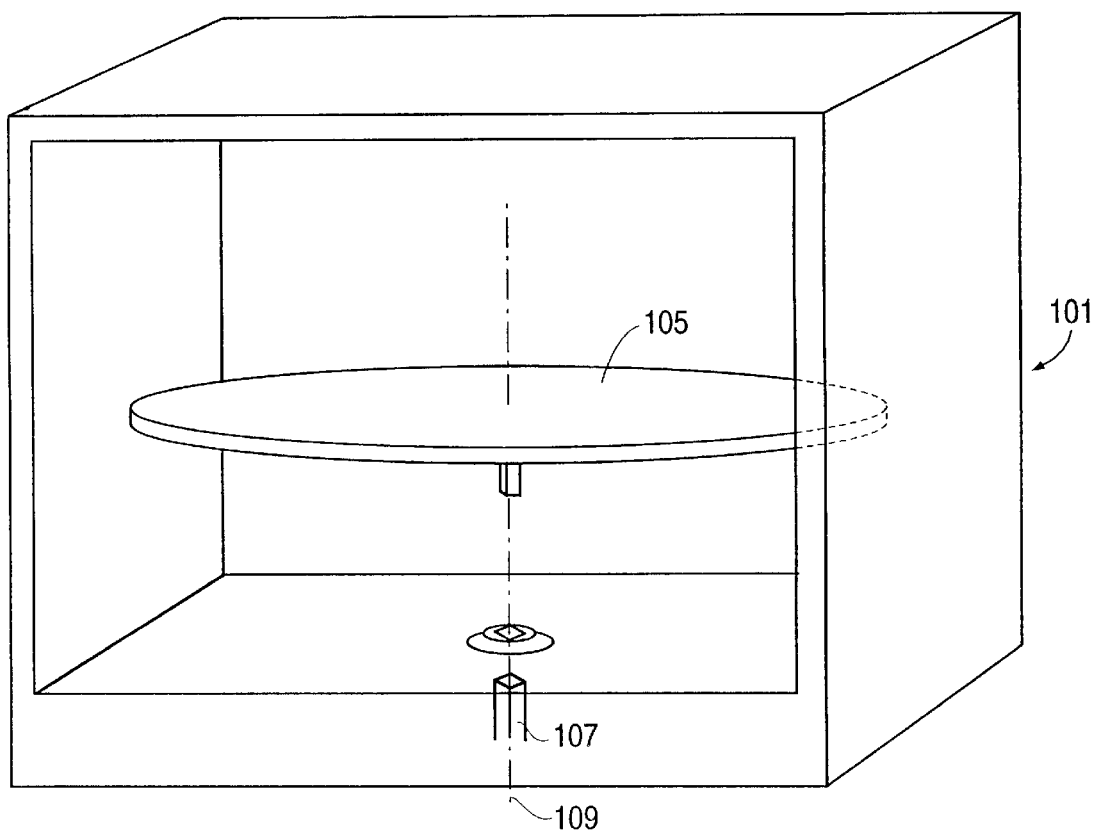
FIG. 1 illustrates a turntable and drive shaft of a conventional microwave oven.

FIG. 1 shows a conventional microwave oven 101 in an exploded view showing a turntable 105 interfacing with a drive shaft 107 so that, in operation, turntable 105 and drive shaft 107 rotate about axis 109.

Figure 2:
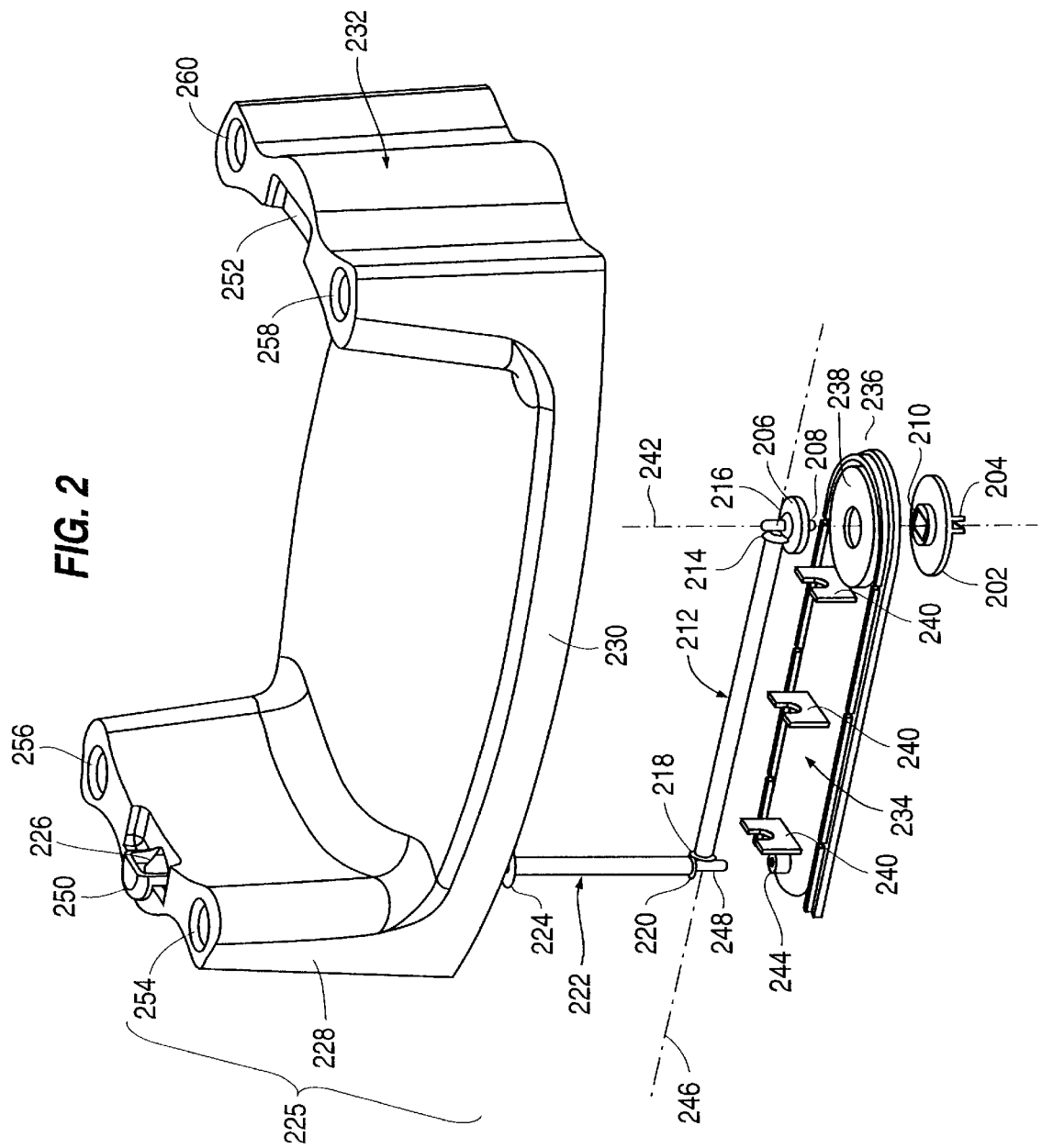
FIGS. 2 and 3 show an embodiment of the invention functioning as either an insert for a conventional oven, or as part of an oven incorporating the invention.
Figure 4A:
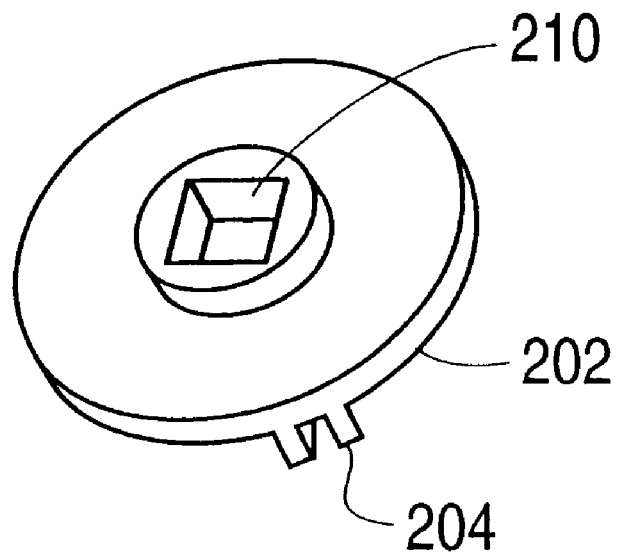
FIGS. 4A and 4B show the universal adapter of FIG. 1.
Figure 4B:
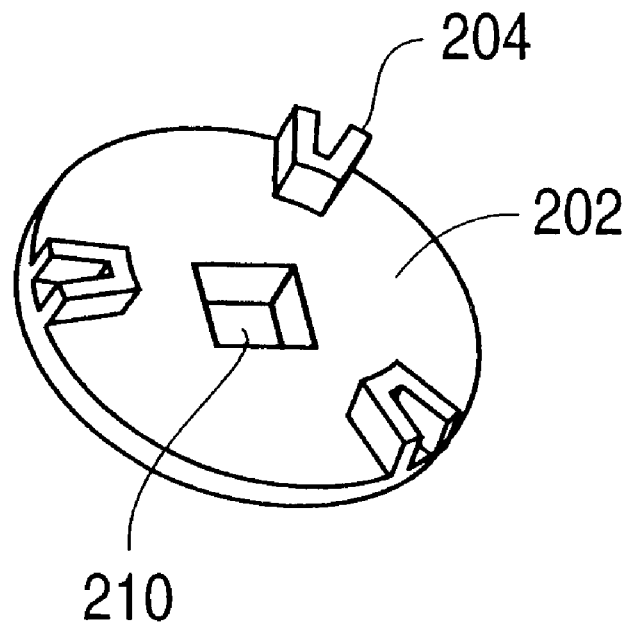

FIG. 2 illustrates an example of an insert according to the invention. Here, a first adapter 202 engages with drive shaft 107 (FIG. 1) through one or more prongs 204. FIGS. 4A and 4B show top and bottom views, respectively, of one example of adapter 202 where in a plurality of prongs 204 are configured to engage with corresponding spaces in the end of drive shaft 107. The prongs 204 of adapter 202 are compatible with each of the conventional drive shaft structures 107a, 107b, 107c and 107d such as those illustrated in FIGS. 5A, 5B, 5C and 5D, respectively, which are used in conventional microwave drive shafts for driving turntables such as turntable 105 (FIG. 1). The adapter 202 of FIGS. 4A and 4B is therefore referred to as a "universal" adapter.

Figure 5A:
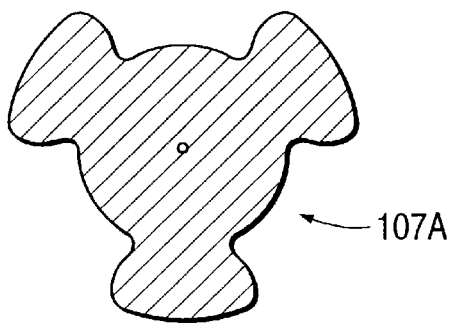
FIGS. 5A–5D are configurations of various drive shafts.
Figure 5B:
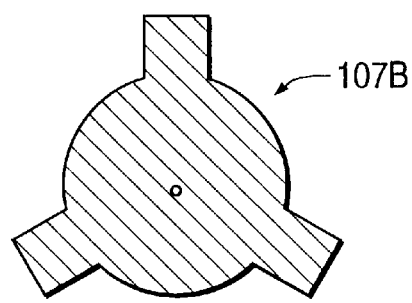
Figure 5C:
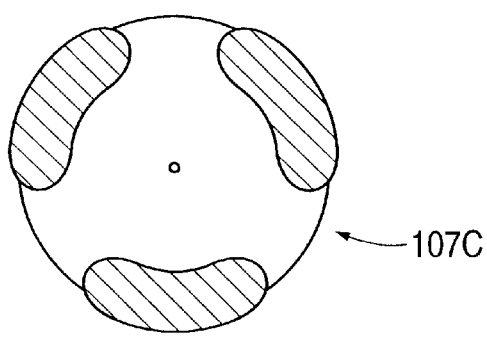
Figure 5D:
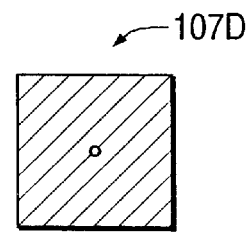

When employed with, for example, the drive shaft of FIG. 5B, the connection between the universal adapter 202 and the drive shaft may have some "play." Thus, the drive shaft may rotate as much as one-quarter turn before imparting rotational forces on prongs 204 of the adapter.

Returning to FIG. 2, a second adapter 206 is compatible with first adapter 202. As shown, and purely by way of example, second adapter 206 includes a male coupling element 208 that fits into a correspondingly sized female coupling element 210 of first adapter 202. Alternatively, first adapter 202 can include a male coupling element that fits with a correspondingly sized female coupling element of second adapter 206.

The device according to the invention also includes a first drive shaft 212 having a first bevelled gear 214 for engagement with a corresponding bevelled gear 216 of second adapter 206. First drive shaft 212 also includes a second bevelled gear 218 which engages a third bevelled gear 220 of a second drive shaft 222. Second drive shaft 222 also includes a fourth bevelled gear 224 which engages a food treatment element.

In the example shown in FIG. 2, fourth bevelled gear 224 is exposed in an opening 226 of a first vertical support portion 228. In this way, fourth bevelled gear 224 can engage a bevelled gear of the food treatment element to impart rotational forces thereon. First vertical support portion 228 is coupled to a base portion 230 and includes a cavity for containing second drive shaft 222. Base portion 230 is coupled to a second vertical support portion 232.

A drive support 234 is positioned intermediate first adapter 202 and second adapter 206 such that, for example, coupling elements 208 and 210 engage an opening 236 in drive support 234. Drive support 234 includes a first support 238 for supporting second adapter 206 in a position vertically displaced from first adapter 202. Drive support 234 also includes a plurality of ribs 240 to support the first drive shaft 212 in a position substantially perpendicular to a central axis 242 of the second adapter 206. Central axis 242 can alternatively be defined as a central axis of first adapter 202, a central axis of hole 236 of first support 238, or as a central axis of drive shaft 107 (FIG. 1).

Drive support 234 also includes a second support 244 to support the second drive shaft 222 in a position substantially perpendicular to a central axis 246 of first drive shaft 212. For example, second drive shaft 222 includes a pin 248 for engagement within a correspondingly sized hole in the second support 244. A third support comparable to the second support 244 is positioned proximate to opening 226 in a hood 250 to hold a corresponding pin extending past the fourth bevelled gear of second drive shaft 222.

Figure 3:
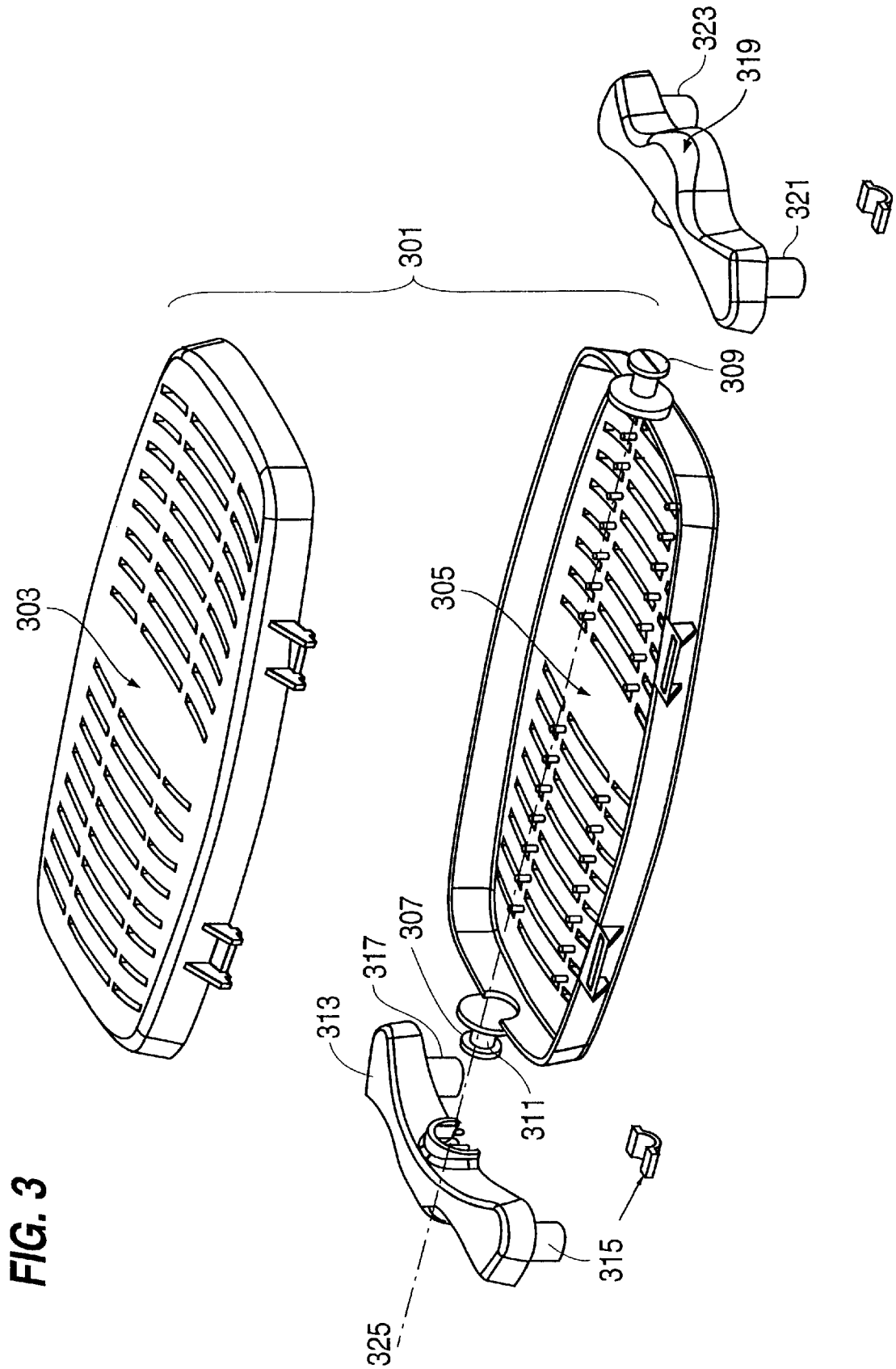

FIG. 3 shows an example of a food treatment element 301, including a top portion 303 and a bottom portion 305. Bottom portion 305 includes a fifth bevelled gear 307 that operationally engages the fourth bevelled gear 224 of second drive shaft 222. Bottom portion 305 also includes an idle gear 309 which engages an idle gear support portion 252 of the second vertical support portion 232 shown in FIG. 2. As shown in FIG. 3, fifth bevelled gear 307 extends from bottom portion 305 on the end of a shaft 311.

FIG. 3 also shows a locking mechanism 313 having a pair of locking posts 315 and 317. When food treatment element 301 is positioned in holding mechanism 225, locking posts 315 and 317 are positioned in a pair of corresponding locking holes 254 and 256, forming a first locking mechanism receiving element, in first vertical support portion 228, so that food treatment element 301 is positioned in a locked position. Similarly, a second locking mechanism 319, having a pair of locking posts 321 and 323, can be positioned in locking holes 258 and 260, acting as a second locking mechanism receiving element, to lock idle gear 309 of food treatment element 301 in place.

Operationally, rotation of drive shaft 107 causes corresponding rotation of first adapter 202 and second adapter 206. Rotation of the second adapter 206 around axis 242 imparts rotation of first drive shaft 212 around axis 246. This causes the second drive shaft 222 to rotate around its longitudinal axis. If the fourth bevelled gear 224 is engaged with a bevelled gear such as fifth bevelled gear 307 of food treatment element 301, the rotation of second drive shaft 222 causes food treatment element 301 to rotate about axis 325. Thus, if food is contained inside food treatment element 301, i.e., between top portion 303 and bottom portion 305, the food is rotated in a rotisserie fashion during operation of the microwave oven, thereby causing a more even distribution of cooking energy to more evenly cook the food.

The food treatment element shown in FIG. 3 is merely by way of example. Other types of food treatment elements can be incorporated into the invention. The common feature of each of these food treatment elements is a fifth bevelled gear, such as fifth bevelled gear 307, to engage with fourth bevelled gear 224 when the food treatment element is locked in place.

Referring to FIGS. 6–10, various attachments will be seen connected to support portions 228 and 230.

Figure 6:
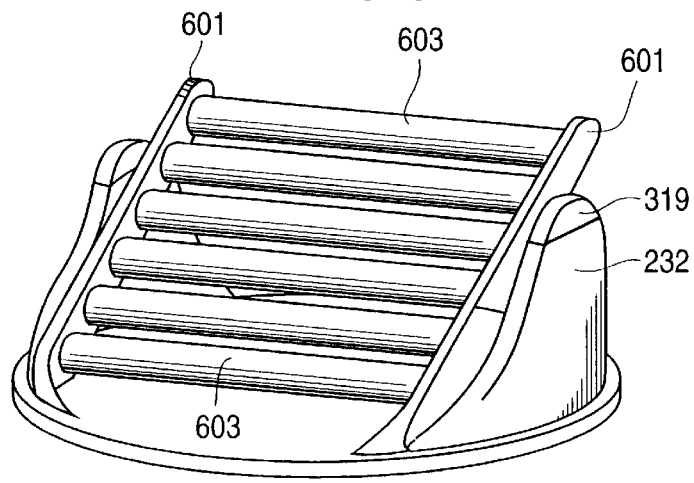
FIG. 6 illustrates a hot dog rotisserie incorporating the invention of FIGS. 2 and 3.

Referring to FIG. 6, a hot dog rotisserie is seen having a pair of roller supports 601 with a plurality of rollers 603 extending therebetween. The rollers 603 are free to rotate relative to the support 601. One roller, 603, will be rotated in the same manner as the drive mechanism as seen in FIG. 2 located on one of the supports 601. Thus, hot dogs can be placed between rollers 603, and they will be rotated in a conventional manner as the rollers 603 rotate.

Figure 7:
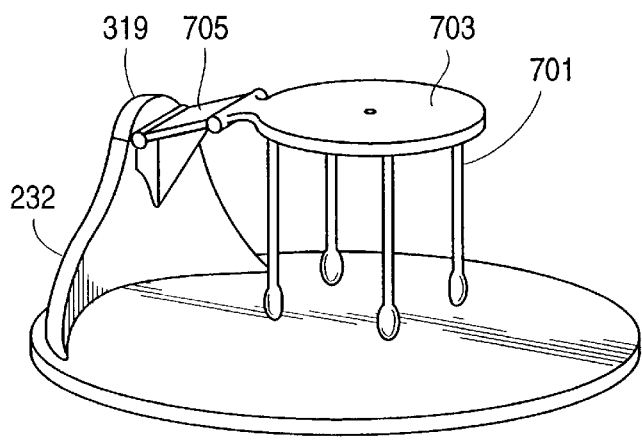
FIG. 7 illustrates a stirring mechanism incorporating the invention of FIGS. 2 and 3.

FIG. 7 illustrates a stirring mechanism wherein a plurality of spoon-like members 701 are suspended from a rotating disk gear (not shown) within a stationary support 703. A drive shaft 705 is connected to elements 226, 250 in FIG. 2. The drive shaft 705 conveys rotation to the disk in support 703, operating in worm gear fashion, wherein the rotating motion of 705 will be transferred to a complementary rotating motion in the disk gear in 703. Thus, one will be able to continuously stir ingredients in a container positioned underneath the spoon-like members 701. This eliminates the disadvantage of having to turn the microwave on and off in order to occasionally stir the ingredients, as is often required by recipes and package instructions.

Figure 8:
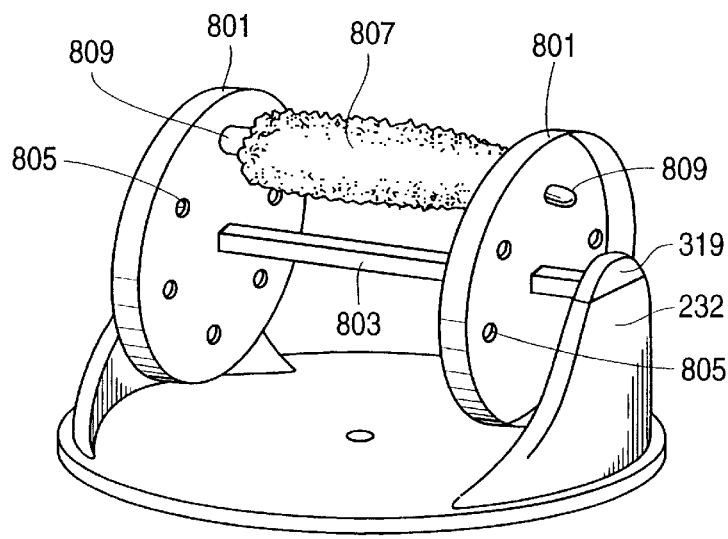
FIG. 8 illustrates a corn cooking mechanism incorporating the invention of FIGS. 2 and 3.

Referring to FIG. 8, a pair of disk-shaped support members 801 are securely mounted to a shaft 803 which is in turn rotated via the mechanism seen in FIG. 2, one end of the shaft being connected to elements 226, 250 and the other resting on element 252. A plurality of apertures 805 are located in the disks 801. An ear of corn, for example, 807 is seen suspended between the members 801 by means of conventional corn holders 809. The disks 801 are adjustable in relation to one another on the shaft 803 so that they can be properly positioned, depending upon the size of the ear of corn. Thus, the corn can be continually rotated until it is properly cooked.

Figure 9:
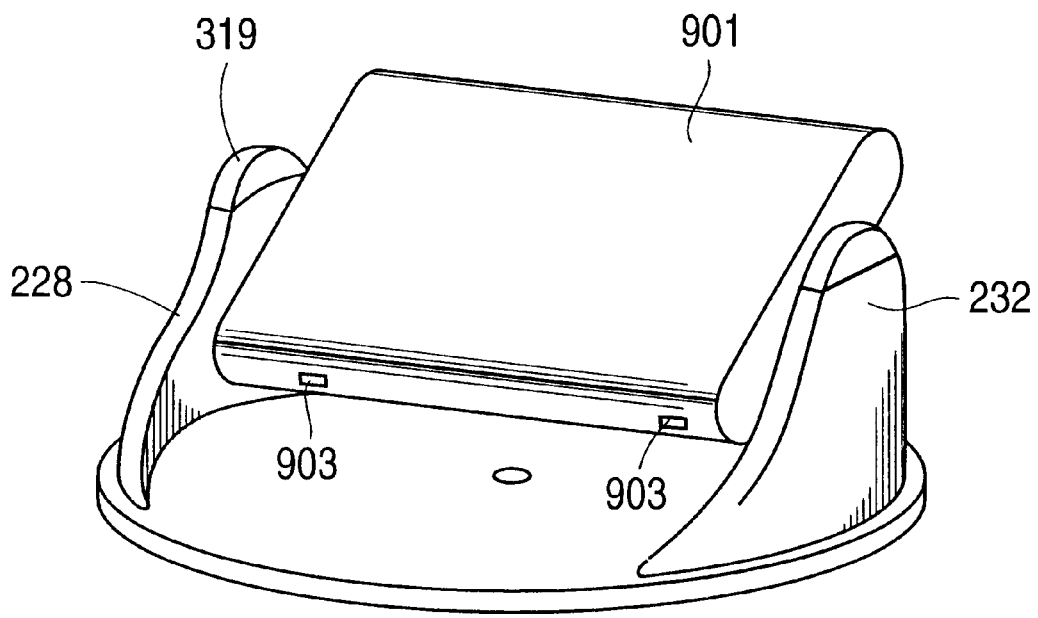
FIG. 9 illustrates a food treatment element incorporating the invention of FIGS. 2 and 3.

Referring now to FIG. 9, a food treatment element 901 is suspended between the supports 228 and 232. The food treatment element has a plurality of hinges 903 which permit it to open and close. Otherwise, it is essentially the same, from the standpoint of operation as that shown in FIG. 3. Element 901 could be a large container and used, for example, as a popcorn popper.

Figure 10:
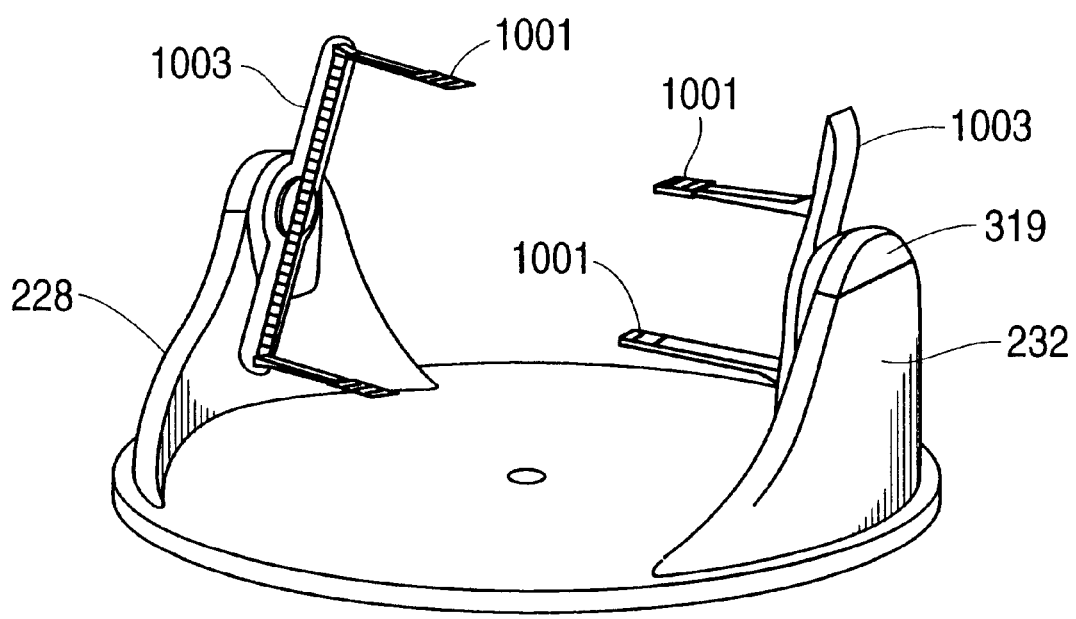
FIG. 10 illustrates a container rotating mechanism incorporating the invention of FIGS. 2 and 3.

Referring now to FIG. 10, two pair of container grippers 1001 are seen adjustably secured to a pair of container supports 1003. The pair of grippers 1001 on the left are seen in their extended position; whereas, the grippers to the right are seen as adjustably moved inward, all depending upon the size of the container. Obviously, each of the pairs may move together, and FIG. 10 simply illustrates various positions. The grippers 1001 will be moved, preferably together in a pair, by means of friction, a rachet or other means so that they can be moved and remain in place. A plastic or other microwave-safe container is positioned between the pairs, and is rotated during the cooking process by the rotation of elements 1003. One of the elements 1003 is attached to mechanism 226, 250, while the other rests on element 252.

Obviously, a rotisserie device having a bar extending between the two support elements, with prongs extendable into the meat, in the usual fashion, is a further alternative.

While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. An insert for an oven having a drive mechanism rotating about a generally vertical axis, comprising:

a base being adapted for mounting above the drive mechanism;

a food treatment element rotatably positioned on a generally horizontal shaft on the base element; and a rotational conversion and transfer mechanism being adapted for converting the rotation of the drive mechanism to the rotation of the food treatment element including an adapting mechanism and at least one drive shaft coupling the food treatment element to the adapting mechanism, the adapting mechanism includes a first adapter compatible with the oven drive mechanism and a second adapter compatible with the first adapter such that when the first adapter is connected to the drive mechanism and the second adapter is connected to the first adapter, rotational forces are transferred from the drive mechanism to the second adapter, and the at least one drive shaft includes a first drive shaft engaged at a first end to the second adapter, and a second drive shaft engaged at a first end to the food treatment element and at a second end to a second end of the first drive shaft;

wherein the first adapter comprises three prongs extending toward the drive mechanism and a first coupling element extending towards the second adapter;

wherein the second adapter comprises a second coupling element compatible with the first coupling element and extending toward the first adapter;

wherein the first drive shaft has a first beveled gear engaging the second adapter and a second beveled gear engaging the second drive shaft;

wherein the second drive shaft has a third beveled gear engaging the second beveled gear and a fourth beveled gear engaging the food treatment element; and wherein the food treatment element has a fifth beveled gear engaging the fourth beveled gear.

2. An insert as recited in claim 1, further comprising a drive support positioned intermediate the first adapter and the second adapter, and including:

a first support supporting the second adapter in a position vertically displaced from the first adapter;

a plurality of ribs supporting the first drive shaft in a position substantially perpendicular to a central axis of the second adapter; and a second support supporting the second drive shaft in a position substantially perpendicular to a central axis of the first drive shaft.

3. An insert as recited in claim 1, further comprising a holding mechanism, the holding mechanism positioning the food treatment element in a desired position while the food treatment element is engaged with the second drive shaft.

4. An insert as recited in claim 3, wherein the holding mechanism comprises a base portion and a first vertical support portion, the first vertical support portion including a cavity for housing the second drive shaft, an opening exposing the fourth bevelled gear of the second drive shaft to the fifth bevelled gear of the food treatment element, and a hood positioned over the opening and including a third support supporting the second drive shaft in the position substantially perpendicular to the central axis of the first drive shaft.

5. An insert as recited in claim 4, wherein the food treatment element includes an idle gear positioned substantially coaxially with the fifth bevelled gear, and the holding mechanism further comprises a second vertical support portion, the second vertical support portion including an idle gear support element for engagement with the idle gear.

6. An insert as recited in claim 4, wherein the fifth bevelled gear extends from the food treatment element on an end of a shaft, and further comprising a first locking mechanism for securing the fifth bevelled gear in the opening.

7. An insert as recited in claim 6, wherein the first vertical support portion includes a first locking mechanism receiving element, the first locking mechanism receiving element being engaged with the first locking mechanism when the food treatment element is positioned in a locked position.

8. An insert as recited in claim 6, further comprising a second locking mechanism for securing the idle gear within the idle gear support element, and wherein the second vertical support portion includes a second locking mechanism receiving element, the second locking mechanism receiving element being engaged with the second locking mechanism when the food treatment element is positioned in the locked position.

9. An insert for an oven as recited in claim 1, further comprising a drive support including:

a first support supporting the adapting mechanism in a position vertically displaced from a bottom of the base;
   a plurality of ribs supporting a first drive shaft in a position substantially perpendicular to the vertical axis of the adapting mechanism; and
   a second support supporting a second drive shaft in a position substantially perpendicular to the vertical axis of the first drive shaft and in engagement with the food treatment element.

10. An insert for an oven as recited in claim 1, wherein the food treatment element is a hot dog rotisserie.

11. An insert for an oven as recited in claim 5, wherein the food treatment element is a stirring mechanism.

12. An insert for an oven as recited in claim 1, wherein the food treatment element is a corn cooking mechanism an enclosed food container.

13. An insert for an oven as recited in claim 1, wherein the food treatment element is a container rotating mechanism.

14. An oven having a drive mechanism rotating about a generally vertical axis, comprising:

an insert comprising a base mounted above the drive mechanism, a food treatment element rotatably positioned on a generally horizontal shaft on the base element; and a rotational conversion and transfer mechanism converting the rotation of the drive mechanism to the rotation of the food treatment element including an adapting mechanism and at least one drive shaft coupling the food treatment element to the adapting mechanism;

a first support supporting the adapting mechanism in a position vertically displaced from a bottom of the base;

a plurality of ribs supporting a first drive shaft in a position substantially perpendicular to the vertical axis of the adapting mechanism;

a second support supporting a second drive shaft in a position substantially perpendicular to the vertical axis of the first drive shaft and in engagement with the food treatment element; and a holding mechanism, the holding mechanism positioning the food treatment element in a desired position while the food treatment element is engaged with the second drive shaft, the holding mechanism comprising a base portion and a first vertical support portion, the first vertical support portion including a cavity for housing the second drive shaft, an opening exposing a driving beveled gear of the second drive shaft to a driven beveled gear of the food treatment element, and a hood positioned over the opening and including a third support supporting the second drive shaft in the position substantially perpendicular to the central axis of the first drive shaft.

15. An oven as recited in claim 14, wherein the food treatment element includes an idle gear positioned substantially coaxially with the driven bevelled gear, and the holding mechanism further comprises a second vertical support portion, the second vertical support portion including an idle gear support element for engagement with the idle gear.

16. An oven as recited in claim 14, wherein the driven bevelled gear extends from the food treatment element on an end of a shaft, and further comprising a first locking mechanism for securing the driven bevelled gear in the opening.

17. An oven as recited in claim 14, wherein the first vertical support portion includes a first locking mechanism receiving element, the first locking mechanism receiving element being engaged with the first locking mechanism when the food treatment element is positioned in a locked position.

18. An oven as recited in claim 14, further comprising a second locking mechanism for securing the idle gear within the idle gear support element, and wherein the second vertical support portion includes a second locking mechanism receiving element, the second locking mechanism receiving element being engaged with the second locking mechanism when the food treatment element is positioned in the locked position.

* * * * *